United States Patent Office 3,669,659

Patented June 13, 1972

3,669,659

PREPARATION OF A SINGLE-METAL PRINTING PLATE WITH IMINOQUINONE DIAZIDE INVOLVING DEVELOPMENT AND DECOATING WITH ALKALINE AQUEOUS SOLUTION OF DIFFERENT STRENGTH

Fritz Uhlig, Wiesbaden-Biebrich, and Jurgen Braun, Wiesbaden, Germany, assignors to Kalle Aktiengesellschaft, Wiesbaden-Biebrich, Germany No Drawing. Filed July 28, 1969, Ser. No. 845,581
Claims priority, application Germany, July 30, 1968, P 17 72 978.1
Int. Cl. G03f 7/02
U.S. Cl. 96—33 8 Claims

ABSTRACT OF THE DISCLOSURE

This invention relates to a process for the preparation of a single metal printing plate from a reproduction material comprising a metallic support and a light-sensitive layer thereon which contains an iminoquinone diazide of the following formula

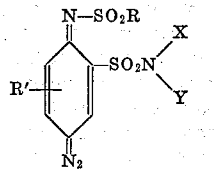

wherein

R is aryl or substituted aryl,
X is hydrogen or alkyl, or forms a polymethylene imine group with Y and the N atom to which X and Y are attached,
Y is alkyl, aryl, substituted aryl, or part of the aforementioned polymethylene imine group, and
R' is hydrogen, halogen, alkyl or alkoxy, and a resin which is soluble in an aqueous alkali solution, in which process the reproduction material is image-wise exposed under an original and developed by means of a weakly alkaline, aqueous solution, thereby baring those areas of the support which correspond to the non-transparent areas of the original. After exposure and development, the reproduction material is coated with an alkali-resistant lacquer and then decoated with a solution which is more strongly alkaline than the solution used for development, thereby baring the areas of the support which were under the transparent areas of the original during exposure, while the areas corresponding to the non-transparent areas of the original remain lacquered.

This invention relates to a process for the preparation of a single-metal planographic printing plate from a reproduction material comprising a light-sensitive layer on a metal support.

Material comprising a metal support with a light-sensitive layer thereon has been known to be processed into planographic printing plates in a manner such that the surface areas of the finished printing plate accepting printing ink adhere to the metal support without the light-sensitive layer, or a layer produced therefrom by a chemical reaction, acting as an intermediary.

Such a planographic printing plate, which is also known as a "single-metal" planographic printing plate, was first produced when it was discovered how to process a dichromate-sensitized gelatin layer, which by nature is negative-working, in such a manner that the effect of a positive-working light-sensitive layer is produced, i.e. that the ink-receptive areas of the finished printing plate are the unexposed areas, without having to use a support containing layers of different metals. This was achieved by a so-called reversal process, in which a negative copy, obtained by exposure under a positive transparency and development and having the metallic support bared in the unexposed areas, was coated with a lacquer, if desired after previous superficial etching, and the areas of the layer hardened by exposure were then softened by means of an aqueous solution and removed from the support. Thereafter, the lacquer adhered to the areas of the metallic support which had been bared and could be used as the ink-receptive element of the printing plate.

This method, which leaves no residues of the original light-sensitive layer on the finished printing plate, also was applied to presensitized material to be used for the preparation of planographic printing plates. German Pat. No. 754,015 describes a "positive copy" obtained by using a material which carries, on a metallic support, a light-sensitive layer containing polyvinyl alcohol and a diazo compound and treating the developed reproduction layer after exposure and development, but prior to ink-ing-up and decoating, with an aqueous solution of mandelic acid. Bis-diazonium compounds and condensation products of diazonium compounds with formaldehyde are mentioned as suitable diazo compounds. However, this process has not been accepted wiedly, presumably because the storability of the pre-sensitized material used is insufficient, especially at high atomspheric humidity. Moreover, the presence of a colloid is a disadvantage when halftones are to be printed, because the colloids tend to swell during development with water, so that the screen dots become smaller. This is also a drawback of the method described in Austrian Pat. No. 264,556. In this patent, a material also is used which contains a water-soluble colloid, viz casein. As the light-sensitive substance, the material used in this method contains an azido stilbene derivative. U.S. Pat. No. 3,287,128 also uses a material which contains a water-soluble colloid, viz water-soluble hydroxyalkyl cellulose ether, in the light-sensitive layer.

Further, a method is known from U.S. Pat. No. 3,406,-065, by which a single-metal plate is obtained. In this known process, either an organic solvent or a weakly alkaline aqueous solution is used for decoating. However, in this known process a light-sensitive layer is employed in which an o-naphthoquinone diazide sulfonic acid derivative is used as the light-sensitive substance, so that the process can be used only when a negative master is available for exposure of the reproduction material.

The present invention provides a process for the preparation of a single-metal printing plate from a storable, presensitized material, which process is free of the disadvantages connected with the use of water-soluble colloids and allows the use of positive masters during exposure. The process of the invention is based on the known process for the preparation of a single-metal planographic printing plate from a reproduction material comprising a metallic support with a light-sensitive layer thereon which contains an imino quinone diazide of the formula

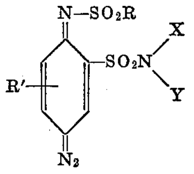

wherein

R is aryl or substituted aryl,

X is hydrogen or alkyl, or forms a polymethylene imine group with Y and the N atom to which X and Y are attached,
Y is alkyl, aryl, substituted aryl, or part of the aforementioned polymethylene imine group, and
R' is hydrogen, halogen, alkyl or alkoxy, and a resin which is soluble in an aqueous alkali solution. In the process, the reproduction material is image-wise exposed under a negative original and developed by means of a weakly alkaline aqueous solution, baring those areas of the support which correspond to the non-transparent areas of the original. After exposure and development, the reproduction material is coated with an alkali-resistant lacquer and then decoated with a solution which is more strongly alkaline than the solution used for development, thus baring the areas of the support which were under the transparent areas of the original during exposure, while the areas corresponding to the non-transparent areas of the original remain lacquered. In contradistinction to the known process, the reproduction material according to the present invention is, of course, exposed under a positive original.

For the process of the invention, a reproduction material is used which includes a metallic support, preferably an aluminum support. The surface of the support carrying the light-sensitive layer is advantageously subjected to at least one mechanical or chemical treatment which enhances anchoring of the light-sensitive layer to the surface of the metallic layer support; such treatments are known. They consist, e.g., in a mechanical roughening of the surface by brushing or sand-blasting or in a chemical attack on the surface by acid or alkaline solutions, e.g. an alkali silicate solution, or in an electrochemical action, e.g. an anodic oxidation. Metallic layer supports pretreated in this manner, which may be used for the preparation of single-metal planographic printing plates, are commercially available.

The benzoquinone imino diazides contained in the light-sensitive layer according to the present invention are known. Their preparation is described in detail in U.S. Pats. Nos. 3,175,906, and 3,180,732.

Novolaks, polystyrene, and polyvinyl resins containing free carboxyl groups have proved suitable as alkali-soluble resins for incorporation in the light-sensitive layers in addition to the benzoquinone imino diazides. In any case, the resin must be soluble in a 3 percent by weight aqueous caustic soda solution at 20° C. to such as degree that a thin layer of the resin can be easily removed from an aluminum surface by means of the soda solution. Etherification products obtained from chloroacetic acid and novolak resin, such as those described in Example 5 of U.S. Pat. No. 3,050,387, are also excellently suitable resins. The quantity of alkali-soluble resin present in the light-sensitive layer ranges from 10 to 200 percent by weight, preferably 100 to 100 percent by weight, calculated on the weight of the benzoquinone-imino-diazide compound present.

For the preparation of the reproduction material to be used according to the invention, solutions are employed which contain one or more benzoquinone imino diazides and one or more alkali-soluble resins. The solutions also may contain, in known manner, further additives, such as dyestuffs or sensitizers. Solutions containing 1 to 20 percent by weight, preferably 3 to 10 percent by weight, of benzoquinone imino diazide compound are normally used for coating the metallic layer support. After drying, the coated layer has a thickness of a few microns, preferably 1 to 6 microns (0.001 to 0.006 mm.). A temperature of up to about 120° C. may be used for drying the coated layer.

In most cases, the coated metal plates are stored for some time in the dark before they are further treated in accordance with the process of the invention. The time of storage is normally at least several days and may be extended to several years.

Exposure is effected under a positive transparency. After exposure, the printing material is developed by wiping it lightly with a weakly alkaline aqueous solution, to remove those parts of the reproduction layer which were protected by the non-transparent areas of the master during exposure.

After development, the material may be etched or "sunk down" in known manner. For the process according to the invention, strong acidic aqueous salt solutions are suitable as etching solutions which are capable of etching the metal bared in the image areas without attacking the light-hardened layer. Chlorides and nitrates of such metals as magnesium, calcium, strontium, barium, zinc, copper, iron, cobalt and manganese and of ammonium may be used, for example. In most cases, mixtures of two or more of the salts mentioned are applied in an aqueous solution. The total concentration of the salts in the etching solution is normally in the range of about 40 to 50 percent by weight. For increasing the etching speed, the etching solutions may contain, in addition, about 0.1 to 4 percent by weight of a free acid, e.g. hydrochloric acid, nitric acid, citric acid, tartaric acid, or lactic acid. By the etching step, the areas of the metal plate bared during development are made more receptive in many cases for the lacquer which is to be applied to the printing material as the next step of the process. Etching may be unnecessary, when the metal plate is of such surface structure that it possesses, per se, a good adherence to the lacquer to be applied.

For lacquering the reproduction material, the entire coated surface of the plate is covered with a solution of a lacquer, the so-called copying lacquer. Any alkali-resistant lacquers may be used for this purpose which contain resins having a good adhesion to metals in solution in organic solvents. The lacquers must be alkali-resistant, i.e. they must have a satisfactory resistance to alkalies, so that the lacquer layers can not be wiped off with the alkaline decoating agent used for decoating the plate later on. The resins contained in these lacquers may be, e.g., phenol resins, polymers or copolymers of vinyl chloride or vinyl acetate, epoxy resins, shellac, alkyd resins, chlorinated rubber and the like. Esters, ketones, benzene hydrocarbons, hydrogenated benzene and naphlene, and the derivatives thereof, and alcohols, are examples of organic solvents, without limiting the solvents suitable for the lacquer solutions to those listed.

After thoroughly drying the lacquer coating, the printing material is advantageously inked up with greasy printing ink before converting it into the finished printing plate, which latter is effected by decoating, i.e. removal of the areas of the layer hardened by light during exposure together with the lacquer layer thereon and, if the material has already been inked up, together with the printing ink on the lacquer layer. Moderately to strongly alkaline aqueous solutions are used for decoating; 1 to 10 percent by weight solutions of ethanol amines, morpholine, aliphatic amines and diamines, ammonia, sodium phosphates, sodium silicates, sodium peroxide, sodium hydroxide, potassium hydroxide, and other substances of a comparable alkaline action are suitable, for erample. If desired, decoating may be accelerated by mechanical treatment, such as brushing, wiping or rubbing in the presence of whiting, pumice powder, or very fine sand.

After decoating, the printing plate is ready for printing. If printing is to be deferred for several hours or days, it is advisable to cover the image side of the printing plate with a preserving solution. This solution may consist, e.g., of an aqueous solution of a colloid, e.g. a 10 percent aqueous solution of gum arabic or a 3 percent aqueous solution of carboxy methyl cellulose of low viscosity or of alginic acid or dextrin.

By the process of the present invention, a single-metal planographic printing plate may be prepared without using a water-soluble colloid in the light-sensitive layer of the reproduction material employed, which has the advantage that a sharper reproduction of the original is obtained. The process is further distinguished in that the presensitized reproduction material used possesses a high light-sensitivity and good storability. Further, in the process of the present invention, aqueous solutions are used both for development and for decoating, so that processing is simple and easy and completely decoated, scum-free printing plates are readily obtained. Moreover, the exposed and developed reproduction layer has a very good resistance to acid etching solutions, but is soluble in aqueous alkaline solutions of moderate concentration. The printing plates obtained by the process of the present invention correctly reproduce the tone values of the originals, under which they are exposed, within a very wide range of exposure times.

The process of the present invention has the further advantage that any areas of the layer remaining after exposure and development, which unintentionally would remain lacquered during further processing, can be easily corrected. Such faults may be caused, e.g., by light diffusion at the edges of the original. All that is necessary for correction is to wipe these areas, prior to lacquering of the material, with any of the known stopping-out solutions which form a water-soluble protective layer (consisting, e.g., of gum arabic or another water-soluble colloid) and to allow the coating to dry. During the decoating step performed in the further course of the process, the areas of the metallic support underneath the dry coating of stopping-out solution are also bared.

The process of the invention will be further described by the following examples:

EXAMPLE 1

A mechanically roughened aluminum plate is sensitized by means of a plate whirler with a solution consisting of:

4.5 g. of 1-((4′-methylbenzene - 1′ - sulfonyl) - amino)-2 - (2″,5″-dimethyl-phenylaminosulfonyl) - benzo-quinone-(1,4)-diazide-(4),
1.5 g. of a styrene copolymer containing carboxyl groups, having a specific gravity of 1.15, and a decomposition temperature of about 200° C.,
0.45 g. of a non-hardenable phenol resin of the novolak type having a melting range of 75–83° C.,
0.9 g. of a phenol-formaldehyde-chloroacetic acid reaction product prepared as described in Example 5 of U.S. Pat. No. 3,050,387,
65.0 g. of methylglycol,
20.0 g. of butyl acetate, and
15.0 g. of dimethylformamide.

The plate is then dried. Presensitized material of this kind can be stored for years in the dark prior to use.

For the preparation of an offset printing form, the presensitized plate is exposed under a positive transparency, and the unexposed areas of the reproduction layer are then removed by wiping the entire surface of the plate with a 1 percent solution of sodium silicate. For superficial etching of the aluminum in the bared metallic image-areas, the plate is wiped for about 2 to 4 minutes with a deep-etch solution of the following composition (percentages by weight):

35.0% of calcium chloride
1.4% of hydrochloric acid
0.6% of copper chloride
0.7% of nitric acid
7.0% of iron chloride, and
55.3% of water.

The plate is thoroughly rinsed with water, dried in a current of warm air, and then wiped by means of a cotton pad with a lacquer containing a vinyl chloride copolymer containing free carboxyl groups, viz. a lacquer which consists of 14 parts by weigth of a copolymer of 85 parts of vinyl chloride, 14 parts of vinyl acetate, and 1 part of maleic acid, dissolved in 100 parts by weight of a solvent consisting of esters. The resin contained in the lacquer adheres very firmly to the bared and superficially etched aluminum areas. After the plate has been thoroughly dried in order to remove the solvents of the lacquer, the entire surface carrying the image is inked up with greasy ink. Finally, the light-hardened areas of the layer in the non-image parts are removed by wiping the surface of the plate with a solution containing, by weight, 40 percent of methanol, 20 percent of glycerol, 35 percent of ethyleneglycol and 5 percent of sodium silicate.

If printing is to be deferred, the printing plate is wiped over with a 5 percent by weight aqueous solution of carboxymethylcellulose and stored at room temperature.

EXAMPLE 2

An electrolytically roughened and superficially anodized aluminum plate having an oxide layer of 10 microns thickness is immersed for 5 minutes at 60° C. in a bath containing a 0.5 percent by weight solution of polyvinyl phosphonic acid in pure water. After rinsing and drying, the plate is sensitized with a solution of the following composition:

4.0 g. of 1-((4′-methylbenzene-1′-sulfonyl)-imino)-2-(2″-ethyl - phenylamino - sulfonyl)-benzoquinone-(1,4)-diazide-(4),
2.8 g. of the novolak described in Example 1,
0.3 g. of Zapon Fast Red BB (Color Index, Part I, 2nd edition, 1956, page 2864),
70.0 g. of tetrahydrofuran, and
30.0 g. of methylglycol.

For the preparation of a printing form, the reproduction material thus obtained is exposed under a positive transparency and the unexposed areas of the layer are then removed by wiping with a 3 percent by weight aqueous solution of trisodium phosphate.

The plate is then lacquered by wiping it with a cellulose pad soaked in a lacquer of the following composition (percentages by weight):

7.0% of chlorinated rubber (low viscosity),
65.0% of xylene,
20.0% of mesitylene,
4.0% of paraffin oil,
3.5% of phthalic acid dimethyl ester, and
0.5% of dyestuff (Fatty Red HRR).

In the bared image areas, the lacquer adheres very firmly to the aluminum. The entire imaged surface is now inked up with greasy ink, and the hardened layer in the image-free areas is then removed with the porous and only loosely adhering lacquer thereon by wiping with an aqueous solution containing (percentages by weight):

2.5% of sodium silicate,
1.5% of sodium triphosphate, and
0.2% of monosodium phosphate.

EXAMPLE 3

A roughened and anodized aluminum band is treated in known manner by immersion in a hot sodium silicate solution and then sensitized with a solution of the following composition:

3.0 g. of 1-((4′-methylbenzene-1′-sulfonyl)-imino)-2-(4″-isopropylphenyl - aminosulfonyl) - benzoquinone-1,4)-diazide-(4),
0.38 g. of copolymer containing 85 percent of vinyl chloride, 14 percent of vinyl acetate, and 1 percent of maleic acid,
1.0 g. of the novolak described in Example 1,
60.0 g. of tetrahydrofuran, and
40.0 g. of methylglycol.

For the preparation of a printing form, the method described in Example 1 is employed.

EXAMPLE 4

An aluminum plate which has been mechanically roughened by means of nylon brushes and then anodized, is sensitized with a solution of the following composition:

5.0 g. of 1 - ((2',4',6' - trimethylbenzene - 1'-sulfonyl)-imino) - 2 - (4''-methoxy-phenylamino-sulfonyl)-benzoquinone-(1,4)-diazide-(4),
1.0 g. of a novolak-phenol resin having a melting range of 108–118° C.,
0.8 g. of a polyvinyl acetate having a specific gravity of 1.16,
80.0 g. of methylglycol, and
20.0 g. of butyl acetate.

A printing form is prepared as described in Example 2.

EXAMPLE 5

A mechanically roughened aluminum band is sensitized with a solution of the following composition:

4.5 g. of 1-((2',4'-dichlorobenzene-1'-sulfonyl)imino)-2-(4'' - methoxyphenylamino - sulfonyl)benzoquinone-(1,4)-diazide-(4),
3.5 g. of a novolak having a melting range of 75–83° C.,
1.0 g. of a novolak having a melting range of 108–118° C.,
0.2 g. of diethylamino-azo-benzene,
80.0 g. of methylglycol, and
20.0 g. of butyl acetate.

For the preparation of a printing form, the method described in Example 1 is used.

It will be obvious to those skilled in the art that many modifications may be made within the scope of the present invention without departing from the spirit thereof, and the invention includes all such modifications.

What is claimed is:

1. A process for the preparation of a single-metal planographic printing plate from a reproduction material comprising a metallic support having a light-sensitive layer thereon, which latter contains a resin soluble in aqueous alkali solution and an imino quinone diazide of the formula

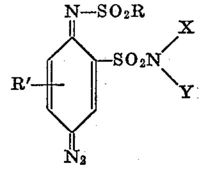

in which

R is an aryl group,
X is selected from the group consisting of hydrogen and alkyl, or forms a polymethylene imine group with Y and the N atom to which X and Y are linked,
Y is selected from the group consisting of alkyl and aryl groups, or forms a part of a polymethylene imine group with X and N, and
R' is selected from the group consisting of hydrogen, halogen, alkyl or alkoxy, which process comprises exposing the reproduction material to light under a master, developing the exposed material by treatment with an alkaline aqueous solution which is as alkaline as an aqueous 3 percent by weight trasodium phosphate solution thereby baring those areas of the support corresponding to opaque areas of the master, coating the exposed material with an alkali-resistant lacquer, and decoating the material with an aqueous solution more strongly alkaline than the solution used for development and which is as alkaline as an aqueous solution of 2.5 percent by weight of sodium silicate, 1.5 percent by weight of sodium triphosphate and 0.2 percent by weight of monosodium phosphate, whereby those unexposed areas of the support which were under the transparent areas of the original during exposure are bared while the areas corresponding to the opaque areas of the original remain lacquered.

2. A process according to claim 1 in which the support is etched after development and before lacquering.

3. A process according to claim 1 in which the reproduction material is inked up with greasy printing ink after lacquering and before decoating with the more strongly alkaline solution.

4. A process according to claim 1 in which the imino quinone diazide is 1 - ((4' - methylbenzene-1'-sulfonyl)-amino)-2-(2'',5'' - dimethyl - phenylamino - sulfonyl)-benzoquinone-(1,4)-diazide-(4).

5. A process according to claim 1 in which the imino quinone diazide is 1-((4'-methylbenzene - 1' - sulfonyl)-imino) - 2 - (2'' - ethyl - phenyl - amino - sulfonyl)-benzoquinone-(1,4)-diazide-(4).

6. A process according to claim 1 in which the imino quinone diazide is 1-((4' - methylbenzene - 1' - sulfonyl)-imino) - 2 - (4'' - isopropylphenyl - aminosulfonyl)-benzoquinone-(1,4)-diazide-(4).

7. A process according to claim 1 in which the imino quinone diazide is 1-((2',4'6' - trimethylbenzene - 1'-sulfonyl)-imino)-2-(4''-methoxy-phenylamino - sulfonyl)-benzoquinone-(1,4)-diazide-(4).

8. A process according to claim 1 in which the imino quinone diazide is 1-((2'4'-dichlorobenzene - 1'-sulfonyl)-imino) - 2 - (4'' - methoxy - phenylamino - sulfonyl)-benzoquinone-(1,4)-diazide-(4).

References Cited

UNITED STATES PATENTS

| | | | |
|---|---|---|---|
| 3,175,906 | 3/1965 | Süs et al. | 96—33 |
| 3,180,732 | 4/1965 | Süs et al. | 96—33 |
| 3,406,065 | 10/1968 | Uhlig | 96—33 |

NORMAN G. TORCHIN, Primary Examiner
W. H. LOUIE, Jr., Assistant Examiner

U.S. Cl. X.R.

96—48, 75, 86, 48